(12) United States Patent
Hsieh

(10) Patent No.: US 7,422,442 B2
(45) Date of Patent: Sep. 9, 2008

(54) LAND GRID ARRAY SOCKET

(75) Inventor: Jeffrey (Fu-Bin) Hsieh, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/823,059

(22) Filed: Jun. 26, 2007

(65) Prior Publication Data

US 2007/0254498 A1 Nov. 1, 2007

Related U.S. Application Data

(63) Continuation of application No. 11/363,644, filed on Feb. 27, 2006, now Pat. No. 7,234,946.

(30) Foreign Application Priority Data

Feb. 25, 2005 (TW) .............................. 94203010 U

(51) Int. Cl.
*H01R 12/00* (2006.01)
(52) U.S. Cl. ........................................ 439/71; 439/862
(58) Field of Classification Search .................... 439/71, 439/55, 66, 607, 73, 331, 862
See application file for complete search history.

(56) References Cited

U.S. PATENT DOCUMENTS 3,910,664 A * 10/1975 Pauza et al. ................... 439/71
3,993,384 A * 11/1976 Dennis et al. .................. 439/71
4,220,383 A * 9/1980 Scheingold et al. ........... 439/71
4,341,433 A * 7/1982 Cherian et al. .............. 439/525
4,502,747 A * 3/1985 Bright et al. ................. 439/296
4,919,623 A * 4/1990 Billman et al. ................ 439/70
5,226,824 A * 7/1993 Karlovich et al. ............. 439/70
5,342,205 A * 8/1994 Hashiguchi ................... 439/66
5,588,847 A * 12/1996 Tate ............................. 439/71
6,464,515 B1 * 10/2002 Wu ............................. 439/108
6,881,070 B2 * 4/2005 Chiang ......................... 439/66
2003/0171032 A1 * 9/2003 Kobayashi ................. 439/607

* cited by examiner

*Primary Examiner*—Michael C Zarroli
(74) *Attorney, Agent, or Firm*—Wei Te Chung

(57) ABSTRACT

An LGA socket (1) includes an insulative housing (2) and a plurality of conductive contacts (3) received in the housing. The housing defines a recessed area (25) surrounded by a number of sidewalls (21). The contacts are received in the recessed area. Each of the sidewall defines a plurality of slots (27) and a plurality of corresponding shielding terminals (4) fastened in the slots. Each shielding terminal includes a fastening portion (41), a linking portion (43) extending from the fastening portion, a first contacting arm (421) extending from one end of the linking portion, and a second contacting arm (422) extending form the other end of the linking portion. The first and second contacting arms dispose out of the sots for elastically connecting with external components.

20 Claims, 5 Drawing Sheets

LAND GRID ARRAY SOCKET

This is a continuation application of patent application Ser. No. 11/363,644 filed Feb. 27, 2006, and now U.S. Pat. No. 7,234,946.

BACKGROUND OF THE INVENTION

1. Field of the Invention

The present invention generally relates to the art of electrical connectors and, more particularly, to a land grid array (LGA) socket to provide electrical connection between an LGA package and an electrical substrate, such as a printed circuit board (PCB).

2. Background of the Invention

Integrated circuit packages are generally classified as pin grid array (PGA) packages, ball grid array (BGA) packages and land grid array (LGA) packages depending on the shape of contacting section of the terminals. An integrated circuit package with conductive pads arranged on a bottom surface thereof in a land grid array is known as an LGA package.

Connectors for removably connecting an LGA package with a PCB are known as LGA sockets. Basically, an LGA socket includes a socket body and a plurality of terminals embedded in the socket body. Each terminal has a contacting section and an opposite connecting section. Under compression, the contacting section of the terminal is resiliently deflected from its natural state and electrically registered with a conductive pad on the LGA package. Thus, a flow of electrical signals is established between the LGA package and the PCB.

A conventional LGA socket is disclosed in U.S. Pat. No. 6,146,152. Referring to FIG. 5, the conventional socket includes an insulative housing 6 and a plurality of conductive contacts 7 received in the housing 6. The housing 6 is rectangular-configured and includes a first sidewall 61, a second sidewall 62, a third sidewall 63 and a fourth sidewall 64. A recessed area 65 is accordingly formed by the above-said sidewalls. The recessed area 65 is used to receive an LGA package 8 therein. The housing 6 defines a plurality of passageways 60 in the recessed area 65 for accommodating the contacts 7 therein. The first sidewall 61 defines a first spring arm 611 extending into the recessed area 65, and the second sidewall 62 defines a second spring arm 621 extending into the recessed area 65. While the LGA package 8 is mounted in the recessed area 65, the first and second spring arms 611, 621 are pressed and provide the package 8 with elastic force to position the package in the recessed area 65.

While the package 8 is working, Electro Magnetic Interference (EMI) is produced, which will affect the performance of other electrical components arranged around the package 8.

Therefore, an improved LGA socket with anti-EMI function is accordingly needed.

SUMMARY OF THE INVENTION

In a preferred embodiment of the present invention, an LGA socket includes an insulative housing and a plurality of conductive contacts received in the housing. The housing defines a recessed area surrounded by a number of sidewalls. The contacts are received in the recessed area. Each of the sidewalls defines a plurality of slots and a plurality of corresponding shielding terminals fastened in the slots. Each shielding terminal includes a fastening portion, a linking portion extending from the fastening portion, a first contacting arm extending from one end of the linking portion, and a second contacting arm extending form the other end of the linking portion. The first and second contacting arms dispose out of the sots for elastically connecting with external components.

Other features and advantages of the present invention will become more apparent to those skilled in the art upon examination of the following drawings and detailed description of preferred embodiment, in which:

DETAILED DESCRIPTION OF THE PREFERRED EMBODIMENT

Reference will now be made to describe the preferred embodiment of the present invention in detail.

Figure 1:
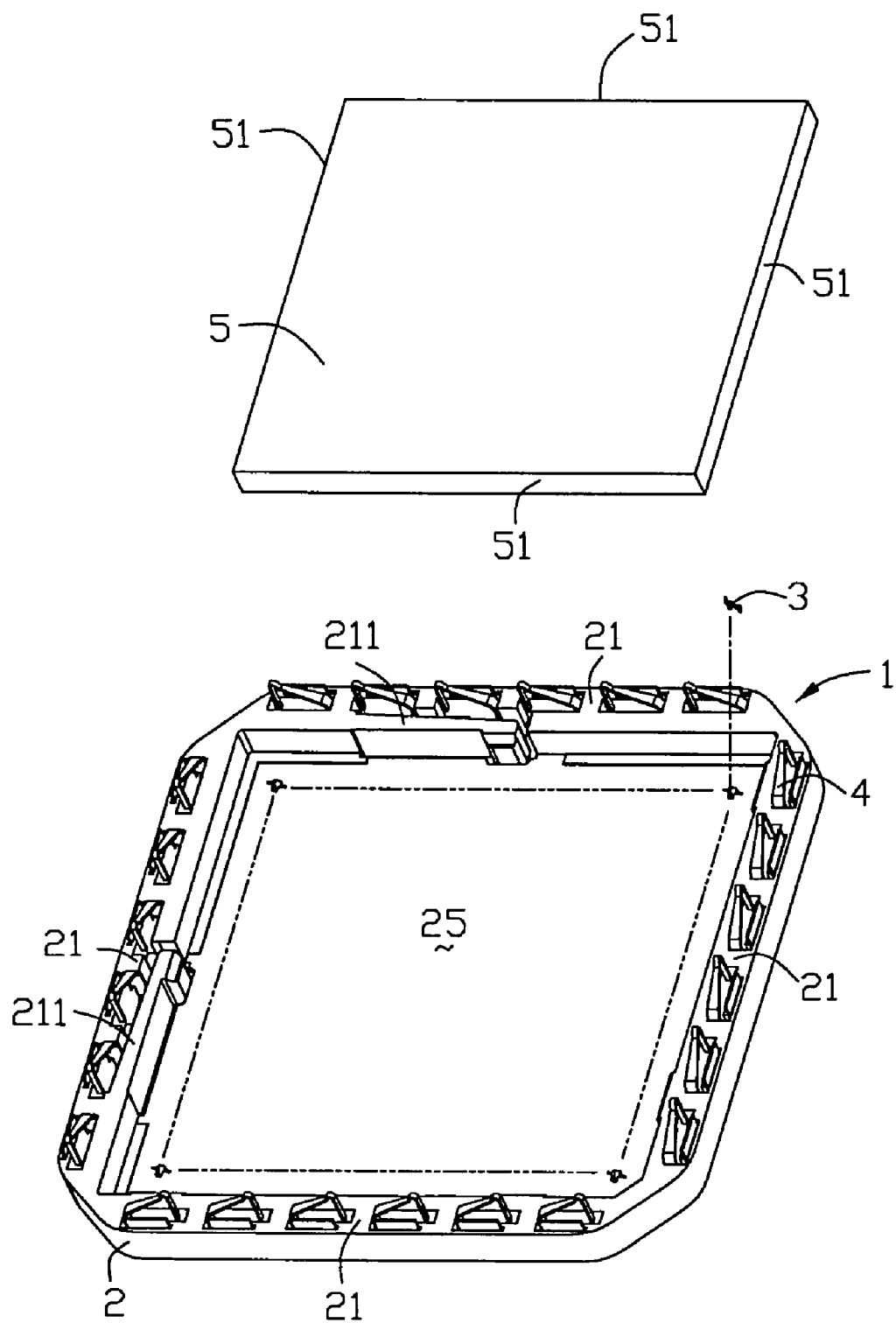
FIG. 1 is an exploded, isometric view of an LGA socket in accordance with a preferred embodiment of the present invention, showing a package ready to be mounted on the socket.
Figure 2:
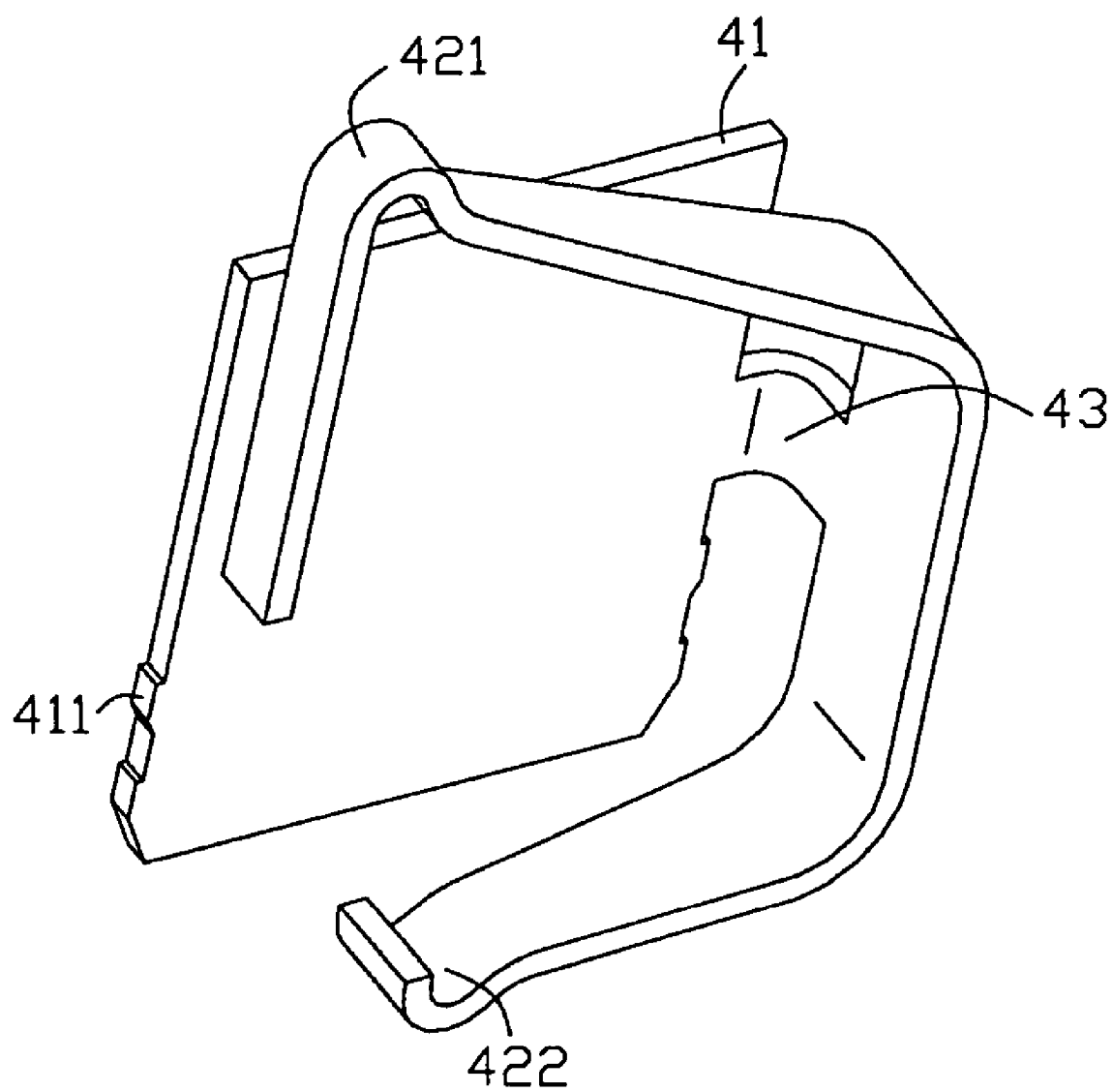
FIG. 2 is an isometric view of a shielding terminal of the socket in FIG. 1.
Figure 3:
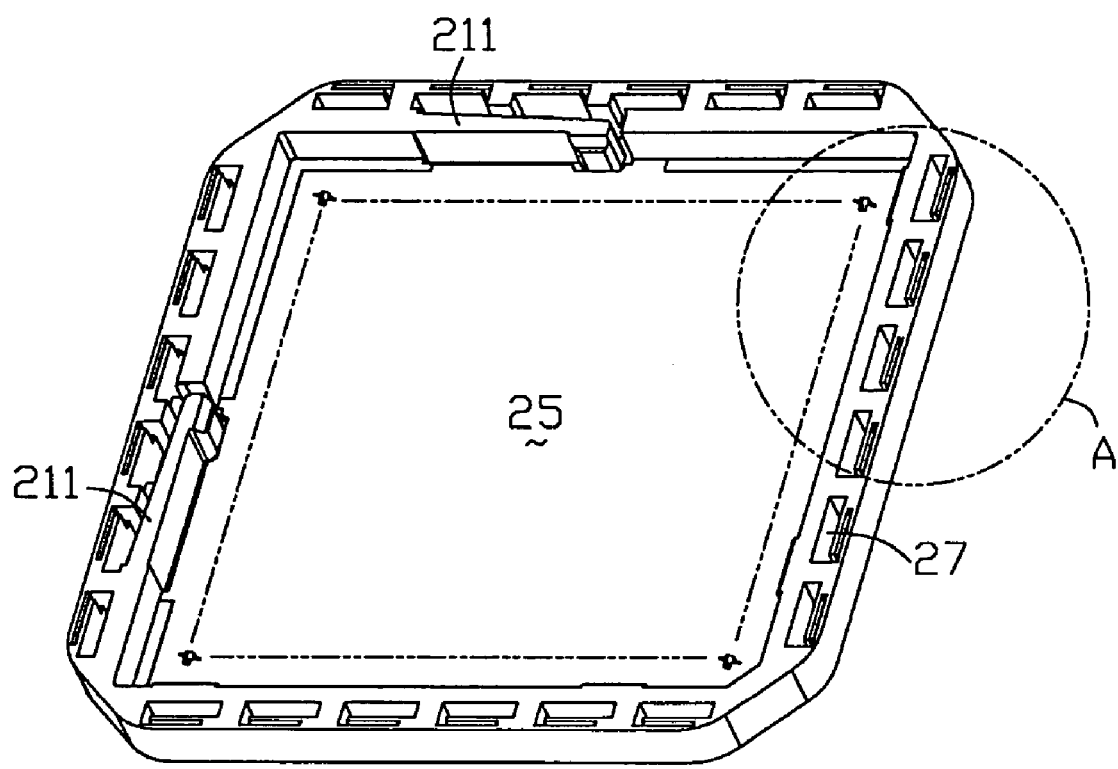
FIG. 3 is an isometric view of an insulative housing of the LGA socket of FIG. 1.
Figure 4:
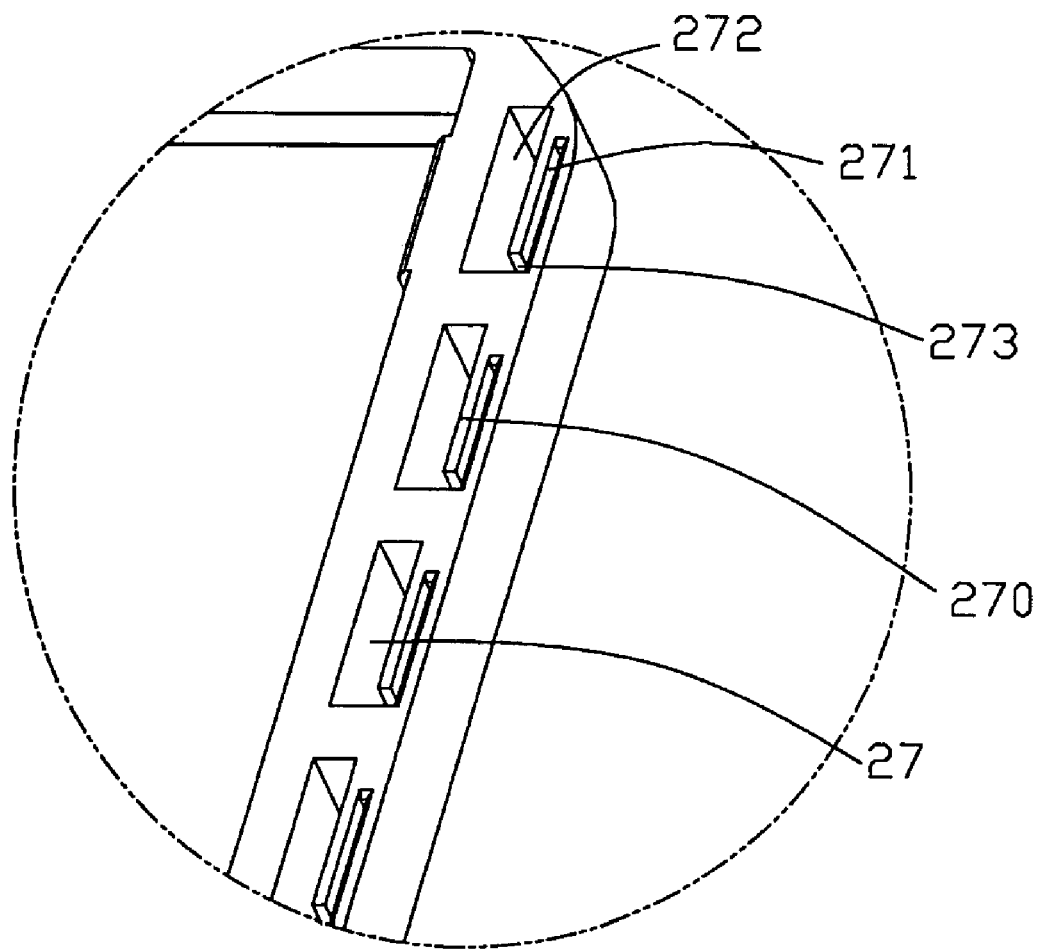
FIG. 4 is an enlarged view of a circled part A in FIG. 3.
Figure 5:
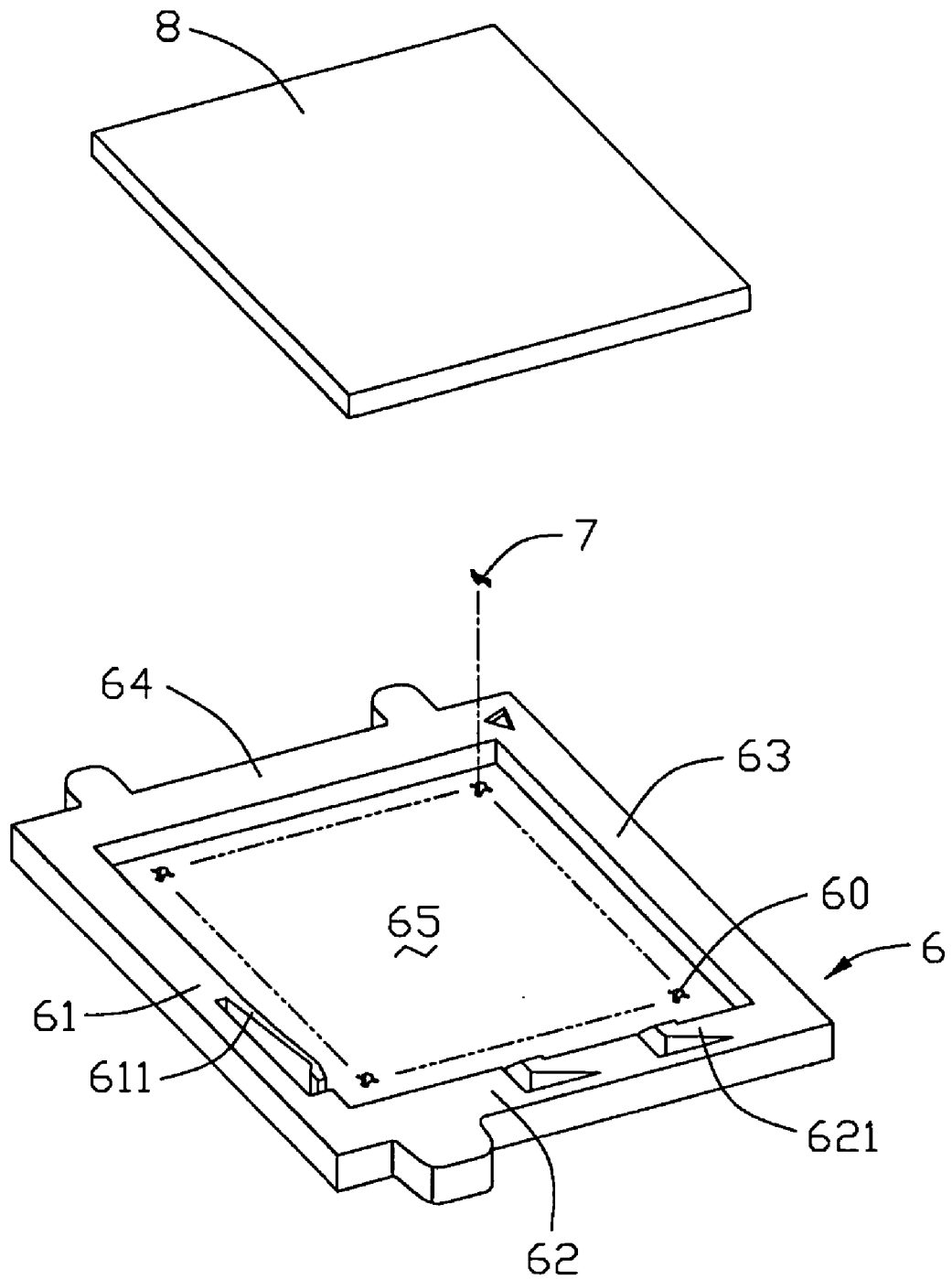
FIG. 5 is an exploded, isometric view of a conventional LGA socket, showing a package ready to be mounted on the socket.

Referring to FIGS. 1-4, a land grid array socket 1 in accordance with a preferred embodiment of the present invention includes an insulative housing 2, a plurality of conductive contacts 3 received in the housing 2, and a number of shielding terminals 4 accommodated in the housing 2. The socket 1 is mounted on a substrate, such as a printed circuit board (not shown), for electrically connecting with a package 5. The shielding terminals 4 are positioned in a peripheral portion (not labeled) of the housing 2. The package 5 is generally rectangular and includes a plurality of sides 51.

The insulative housing 2 includes a plurality of sidewalls 21 for forming a recessed area 25. The recessed area 25 is used for receiving the package 5 therein. The recessed area 25 includes a bottom wall (not labeled) defining a plurality of passageways (not labeled) for accommodating the contacts 3. Each of the sidewalls 21 defines a plurality of slots 27 for holding the shielding terminals 4. Each slot 27 includes a fastening channel 271, a receiving channel 272, and a connecting channel 273 communicating the fastening channel 271 and the receiving channel 272. A partition wall 270 is accordingly formed between the fastening channel 271 and the receiving channel 272. The slot 27 perforates a whole thickness of the sidewall 21. The housing 2 defines a plurality of spring arms 211 extending from two adjacent sidewalls 21.

Each of the shielding terminal 4 includes a rectangular plate-like fastening portion 41, a linking portion 43 extending from the fastening portion 41, a first contacting arm 421 extending from one end of the linking portion 43, and a second contacting arm 422 extending from another end of the linking portion 43. The fastening portion 41 defines a plurality of barbs 411 for fixing the shielding terminal 4 in the slot 27.

While the shielding terminal 4 is assembled with the sidewall 21 of the housing 2, the fastening portion 41 of the shielding terminal 4 is interferentially received in the fastening channel 271, and the first and second contacting arms 421,

422 are partially received in the receiving channel 272. The linking portion 43 is located in the connecting channel 273. The first and second contacting arms are partially disposed out of the slot 27. It is noted that the plate-like fastening portion 41 should face the recessed area 25 for forming a discontinuous shielding wall (not labeled).

When the socket. 1 is used, the socket 1 is mounted on the printed circuit board, and the package 5 is received in the recessed area 25. The spring arms 211 presses on sides of the package 5 for restricting the package 5 in the recessed area 25. A heat sink (not shown) is mounted on the package 5 for dissipating heat produced during the working procedure of the package 5. Thus, the socket 1 is sandwiched between the heat sink and the printed circuit board. The first contacting arm 421 is elastically pressed by the heat sink, and the second contacting arm 422 is elastically pressed on the printed circuit board. The heat sink, the shielding terminals, and the printed circuit board form a shielding path for eliminating the EMI produced by the package 5. The EMI produced by the package 5 can be effectively eliminated by the above-said shielding wall.

While the present invention has been described with reference to a specific embodiment, the description of the invention is illustrative and is not to be construed as limiting the invention. Various of modifications to the present invention can be made to the preferred embodiment by those skilled in the art without departing from the true spirit and scope of the invention as defined by the appended claims. For example, the shielding terminal may be arranged in an oblique manner with the corresponding side wall of the housing and/or further overlapped with the neighboring one in the lateral direction perpendicular to said side wall for better mechanical and electrical performance.

What is claimed is:

1. A socket, for electrically connecting a package to a substrate, comprising:
    an insulative housing defining a plurality of sidewalls commonly forming an upwardly facing recessed area for receiving the package;
    a plurality conductive contacts accommodated in the recessed area; and
    a plurality of shielding terminals fastened in the sidewalls of the housing; wherein
    each sidewall defines a plurality of slots for holding the shielding terminals, and the shielding terminal comprises a plate-like fastening portion fastened in the slot, a first spring arm extending from the fastening portion in an upward direction with a part thereof disposed out of the slot, and a second spring arm extending from the fastening portion in a downward direction with a part thereof disposed out of the slot; wherein
    the plate-like fastening portion is embedded within the corresponding sidewall and sidewall hidden from an exterior.

2. The socket as described in claim 1, wherein the fastening portion further defines a linking portion extending from a lateral side of the fastening portion, and the first and second spring arms extend form two opposed ends of the linking portion.

3. The socket as described in claim 1, wherein the fastening portion defines a plurality of barbs on lateral sides thereof.

4. The socket as described in claim 1, wherein the slot comprises a fastening channel for holding the fastening portion, a receiving channel for receiving the spring arms.

5. The socket as described in claim 4, wherein the slot further comprises a connecting channel communicating the fastening channel and the receiving channel.

6. The socket as described in claim 5, wherein the fastening channel, the receiving channel and the connecting channel perforate a whole thickness of the sidewall.

7. The socket us described in claim 5, wherein the slot further defines a partition wall between the fastening channel and the receiving channel.

8. An electrical socket assembly comprising:
    a printed circuit board;
    a heat sink;
    a package suppressed by the heat sink;
    a socket carrying the package comprising:
    an insulative housing defining a plurality of sidewalls commonly forming an upwardly facing recessed area for receiving the package, the sidewalls forming an upper surface for carrying the heat sink and a bottom surface facing tire printed circuit board;
    a plurality conductive contacts accommodated in the recessed area; and
    a plurality of shielding terminals fastened in the sidewalls of the housing; wherein
    each sidewall defines a plurality of slots for holding the shielding terminals, and the shielding terminal comprises a plate-like fastening portion fastened in the slot, a first spring arm extending from the fastening portion in an upward direction with a part above the upper surface, and a second spring arms extending from the fastening portion in a downward direction with a part below the bottom surface, wherein
    the plate-like fastening portion is embedded within the corresponding sidewall and sideward hidden from an exterior.

9. A socket, for carrying a package, comprising:
    an insulative housing defining a plurality of passageways in a middle portion thereof;
    a plurality of conductive contacts received in the passageways for electrically connecting with the package;
    a plurality of discrete shielding terminals fastened in a peripheral portion of the housing forming a discontinuous shielding wall surrounding the middle portion; wherein
    each of said shielding terminals defines a main body which is either parallel to or oblique to a side wall of the peripheral portion; wherein
    said main body includes a large plate embedded within the corresponding peripheral portion and sideward hidden from an exterior.

10. The socket as described in claim 9, wherein each of the shielding terminals further includes at least one spring arm extending out of one of opposite upper and lower faces of the housing for conductive engagement with an external part.

11. The socket as described in claim 10, wherein a fastening portion of the shielding terminal faces the middle portion of the housing.

12. The socket as described in claim 11, wherein the fastening portion further defines a linking portion extending from a lateral side of the fastening portion, and the spring arms extend from two opposed ends of the linking portion.

13. The socket as described in claim 11, wherein the peripheral portion defines a number of slots, each of the slots comprising a fastening channel holding the fastening portion, a receiving channel for receiving the spring arm.

14. The socket as described in claim 13, wherein the slot further comprises a connecting channel communicating the fastening channel and the receiving channel.

15. The socket as described in claim 14, wherein the fastening channel, the receiving channel and the connecting channel perforate a whole thickness of the peripheral portion of the housing.

16. The socket as described in claim 15, wherein the slot further defines a partition wall between the fastening channel and the receiving channel.

17. The socket as described in claim 9, wherein the peripheral portion is higher than the middle portion, and said upper face is defined on the peripheral portion.

18. The socket as described in claim 9, wherein the peripheral portion defines a plurality of side sections, and each of said side sections receives a plurality of said shielding terminal.

19. The socket as described in claim 10, wherein the spring arm of each aid shielding terminals extends out of the upper face.

20. The socket as described in claim 10, wherein each of said shielding terminals includes two said spring arms respectively extending out of the corresponding upper and lower faces, respectively.

\* \* \* \* \*